(12) United States Patent
Wakayama

(10) Patent No.: US 6,897,733 B2
(45) Date of Patent: May 24, 2005

(54) LOW OFFSET AND LOW GLITCH ENERGY CHARGE PUMP FOR PLL-BASED TIMING RECOVERY SYSTEMS

(75) Inventor: Myles H. Wakayama, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 1 day.

(21) Appl. No.: 09/972,019

(22) Filed: Oct. 5, 2001

(65) Prior Publication Data

US 2002/0050864 A1 May 2, 2002

Related U.S. Application Data

(63) Continuation of application No. 09/649,197, filed on Aug. 28, 2000, now Pat. No. 6,326,852, which is a continuation of application No. 09/398,101, filed on Sep. 16, 1999, now Pat. No. 6,181,210.
(60) Provisional application No. 60/101,555, filed on Sep. 21, 1999.

(51) Int. Cl.$^7$ .............................................. H03L 7/093
(52) U.S. Cl. ............................ 331/17; 331/8; 331/25; 327/157
(58) Field of Search ................................ 331/17, 25, 8, 331/16; 327/157

(56) References Cited

U.S. PATENT DOCUMENTS

| | | | |
|---|---|---|---|
| 5,508,660 A | 4/1996 | Gersbach et al. | 331/17 |
| 5,942,949 A | 8/1999 | Wilson et al. | 331/171 |
| 6,181,210 B1 * | 1/2001 | Wakayama | 331/8 |
| 6,326,852 B1 * | 12/2001 | Wakayama | 331/17 |

* cited by examiner

*Primary Examiner*—Arnold Kinkead
(74) *Attorney, Agent, or Firm*—Sterne, Kessler, Goldstein & Fox P.L.L.C.

(57) ABSTRACT

A high precision charge pump used in a phase-lock-loop incorporating a phase/frequency detector is designed and constructed to substantially eliminate the effects of DC offset and glitch errors on the charge pump output current. The high precision charge pump is constructed of parallel current paths each having a central node which is, in turn, connected to a feedback element. The feedback element defines a feedback current which is applied to the charge pump so as to maintain the two central nodes at an equipotential level and to maintain the value of the pump-down current exactly equal to the value of the pump-up current output by the device.

14 Claims, 4 Drawing Sheets

LOW OFFSET AND LOW GLITCH ENERGY CHARGE PUMP FOR PLL-BASED TIMING RECOVERY SYSTEMS

CROSS-REFERENCE TO RELATED APPLICATIONS

This application is a continuation of application Ser. No. 09/649,197, filed Aug. 28, 2000, now U.S. Pat. No. 6,326,852, entitled LOW OFFSET AND LOW GLITCH ENERGY CHARGE PUMP FOR PLL-BASED TIMING RECOVERY SYSTEMS, which is a continuation of 09/398,101, filed Sep. 16, 1999, now U.S. Pat. No. 6,181,210, entitled LOW OFFSET AND LOW GLITCH ENERGY CHARGE PUMP FOR PLL-BASED TIMING RECOVERY SYSTEMS, and which is related to provisional application Ser. No. 60/101,555, filed Sep. 21, 1998, entitled LOW OFFSET AND LOW GLITCH ENERGY CHARGE PUMP DESIGN, all commonly owned by the Assignee of the present invention.

FIELD OF THE INVENTION

The present invention is directed to high speed data transmission and conversion systems and, more particularly, to a system for and a method of controlling the average current output of a charge pump such that glitch energy and offset voltage errors are minimized.

BACKGROUND OF THE INVENTION

The past several years have witnessed a dramatic increase in the capabilities of high-speed, high-density, broadband data communication systems. Pertinent such systems range anywhere from broadcast or cablecast HDTV systems, local area and wide area (LAN, WAN) systems for multimedia, fibre to the home (FTTH) applications and board-to-board interconnections in exchange systems and computers.

In any one of the foregoing applications, it should be noted that bidirectional data communication is in digital form and, accordingly, clock and data recovery circuitry is a key component of the efficient functioning of modern data communications systems. The ability to regenerate binary data is an inherent advantage of transmitting information digitally as opposed to transmitting such information in analog form. However, in order for the intelligence signal to be correctly reconstructed at the receiving end, the transmitted binary data must be regenerated with the fewest possible number of bit errors, requiring received data to be sampled at an optimum sample rate and at an optimum instance of time. Given the bandwidth constraints imposed on most modern data communication systems, it is generally impractical to transmit the requisite sampling clock signal separate from the transmitted datastream. Timing information is consequently derived from the incoming transmitted data signal itself. Extraction of the implicit timing signal is generally termed timing recovery (or clock recovery) in it's functional role in general digital receiver technology, is traditionally performed by a phase-lock-loop system such as that illustrated in FIG. 1.

Phase-lock-loops operate to compare the frequency and/or phase of an incoming serial datastream to a periodic reference clock signal generated by an oscillator circuit, and to adjust the operational frequency and phase characteristics of the oscillator until its output stream is "locked" in both frequency and phase to the data signal. A reference clock is thereby established which, in turn, controls operation of a decision circuit which regenerates (or retimes) the data signal. The phase-lock-loop suitably comprises a phase detector 10 whose output is coupled to a charge pump circuit 12, operatively connected, in turn, to a loop filter 13 and a voltage controlled oscillator (or VCO) 14.

The data signal is received at a data input of the phase detector 10, in which the occurrence of the data's rising edge (its phase) is compared in time to the occurrence of a rising edge (the phase) of an output signal of the VCO 14. Conventionally, the phase detector incorporates logic circuitry (in effect a logical XNOR function) which precludes an output signal from being issued during phase comparisons unless two rising edges are present during a comparison cycle. This feature prevents the phase-lock-loop from becoming unstable by trying to perform a phase comparison between a VCO rising edge and a DATA ZERO bit (necessarily without a rising edge). It will be understood that the phase comparison result in such a situation would indicate either an infinite phase lead or an infinite phase lag, thus causing the VCO frequency to run out of control.

According to convention, the phase detector 10 issues a PUMP UP signal 16 to the charge pump 12 if the datastream phase leads the VCO signal, and issues a PUMP DN 18 if the datastream phase lags the VCO signal. PUMP UP and PUMP DN are directed to the charge pump 12 which sources or sinks a particular amount of current (the pump current) to or from, respectively, the loop filter 13. Voltage is developed as the pump current is sourced or sunk, with the voltage being used to control the operational frequency of the VCO 14. The sign of the VCO control voltage variation depends on whether the phase of the datastream leads or lags the phase of the VCO output and its magnitude is a function of the extent of the phase lead or phase lag. Thus, the operational frequency of the VCO 14 is increased or decreased, as appropriate, to reduce the phase lead or phase lag of the inputs to the phase detector 10. The phase-lock-loop thus ensures that the VCO output, which is used as a timing reference, is locked in phase with the incoming serial datastream. Once the PLL is "locked", the timing reference signal (i.e., the VCO output) is used to control operation of a decision circuit 19 which defines regenerated or retimed data which defines regenerated or retimed data.

A particular shortcoming of prior art phase-lock-loop systems is that the charge pump is required to source and sink current which precisely represents the magnitude and polarity of a phase difference between incoming data and the VCO. In addition, for a type II or a type IV phase detector operating in quasi flywheel mode, the charge pump is required to source and sink current in such a manner that the output current, averaged over a correction cycle, equals 0. In other words, the charge pump should ideally only cause corrections to be made to the operating characteristics of the VCO which result from consistent frequency shifts of the datastream, such that the VCO is locked to the mean phase of the incoming datastream rather than to the phase of any specific data bit.

Maintaining perfect phase-lock VCO to data, however, is particularly difficult for conventional prior art-type phase-lock-loop circuits operating in the GHz range, because of the internal construction of conventional prior art-type charge pump circuits. In addition, the source and sink current waveforms, of such conventional charge pump circuits, exhibit significant amounts of offset and "glitch errors" which cause the source and sink current waveforms to be non-symmetrical. This non-symmetry necessarily results in a residual charge being left on the filter capacitor at the end of a correction cycle and further causes a non-zero increment to the control voltage $V_c$ to the VCO. The terms "offset" and "glitch errors" refer to fluctuations in the source and/or sink current waveforms and represent quantifiable departures from a smooth waveform characteristic. These fluctuations are caused by a variety of factors, the majority of which are functions of the physical and electrical properties of semiconductor integrated circuit transistors and integrated circuit charge pumps manufactured therefrom and exhibit the response characteristics illustrated in FIG. 2.

Offset is an undesirable quantum of charge output from a charge pump when the PUMP UP and PUMP DN signals applied to the input of the charge pump are identical (i.e., the output of the charge pump should be flat or zero). This DC offset current tends to perturb the system in one direction or the other and results in timing jitter at the output of the VCO. Glitch energy is a sharp transition peak signal defined at the output of the charge pump, caused in major part by transition edge (clock) feed through effects of the input signals.

To better understand the causes of offset and glitch errors, it will be helpful to review the common and well-known charge pump architecture depicted in simplified form in FIG. 3.

Conceptually, a charge pump may be viewed as a "pump up" current source 20 connected in series with a switch 22 to provide an output source current in response to a PUMP UP signal issued by a, for example, phase detector. Similarly, a "pump down" current sink 24 is coupled between a $V_{ss}$ supply and a second switch 26 which, together function to define a sink current in response to a PUMP DN signal from the phase detector. While relatively simple, the simplified charge pump design of FIG. 3 can be used to illustrate several practical problems with contemporary charge pump design. For example, DC mismatches in the up and down current sources 20 and 24 necessarily cause a DC offset in the charge pump output when both PUMP UP and PUMP DN activate the respective switches 22 and 26, at the same time.

Likewise, the voltage node between the current source 20 and switch 22 on the "UP" side of the charge pump will rise to $V_{DD}$ when the pump-up switch 22 is in an open condition. The voltage node between the current sink 24 and switch 26 on the pump-down side of the charge pump will go to $V_{ss}$ when the pump-down switch is in an open condition. These conditions cause a DC offset in the charge pump output that is necessarily dependent on the output voltage because of well-known parasitic capacitance effects that are present on the above-described nodes. In addition to the offset effects inherent in contemporary charge pump designs, it will be understood that as the switches 22 and 26 open and close in response to PUMP UP and PUMP DN signals issued by the phase detector, voltage spikes, ground bounce, and the like, will cause a sharp "ring" spike at transition edge instants. Spikes, ringing and other non-linearities introduced by switch transients, clock feed through effects, and the like, are subsumed into the term "glitch energy".

Accordingly, prior art-type charge pump circuits do not provide a smooth, constant and symmetrical response characteristic between their source and sink currents during phase lock, thus introducing variation to the loop filter and, consequently the VCO output. This variability becomes proportionately more significant as the VCO frequency increases. Accordingly, for high-speed phase-lock-loops, there is a demonstrated need for a high precision charge pump which is designed and constructed such that glitch errors and DC offsets are minimized for both source and sink phases of a detection cycle, such that the average current, integrated across the cycle, more closely approximates zero.

SUMMARY OF THE INVENTION

A high-speed phase lock loop circuit includes a high precision charge pump which functions to maintain the stability of VCO lock by providing source and sink pump currents which are substantially zero over phase correction cycle. The uniformity of source and sink currents is imposed by valuating the voltages at the common drain nodes of the charge pump's first and second parallel conduction paths by a feedback element. The feedback element controls the value of an "adjust" current source so as to drive the two common drain nodes to an equi-potential level.

In one aspect of the invention, a phase lock loop includes a phase/frequency detector for comparing a phase or frequency characteristic of an input signal to a phase or frequency characteristic of a timing reference signal developed by a voltage controlled oscillator (VCO), numerically controlled oscillator (NCO) or the like. A charge pump sources and sinks characteristic current in response to control signals developed by the phase/frequency detector, in response to a phase or frequency comparison event. The charge pump is constructed of two parallel current paths, each a mirror image of the other, and both coupled between a pump-up current source and a pump-down current source.

Each of the two parallel current paths is constructed of an upper switch connected in series with a lower switch with the common nodes of each parallel current path defining a respective output node. The upper switch may be constructed of an N-channel transistor, while the lower switch may be constructed of a P-channel transistor. The charge pump includes a feedback element coupled between the output nodes and an "adjust" current source which functions to balance currents in the two parallel current paths so as to minimize DC offsets at the circuit output.

In a further aspect of the invention, a first output node defined by the common nodes of the upper and lower switches defining one of the parallel current paths is coupled to a loop filter, connected between the charge pump and a VCO. The loop filter develops a control voltage for the VCO in response to a characteristic current sourced or sunk by the charge pump and received from the first output node. The loop filter includes an RC network coupled between the charge pump's first output node and a reference potential, and including a resistor element in series with a first capacitor defining a zero of the filter.

In an additional aspect of the invention, the charge pump includes a second output node defined by the common nodes of the upper and lower switches defining a second one of the parallel current paths. The second output node is coupled to a reference potential through a third "dump" capacitor having a value substantially the same as the "zero" capacitor coupled to the first output node.

An amplifier, such as a transconductance amplifier, has first and second inputs coupled, respectively, to the first and second output nodes and an output connected to control operation of an "adjust" current source. The "adjust" current source might be provided separately or, might be incorporated into the charge pump's "pump-up" or "pump-down" current sources directly. The amplifier thus forces the common drain nodes of each of the current paths to be maintained at an equi-potential value with respect to one another. By maintaining the dump capacitor node and the zero capacitor node at the same voltage during operation of the charge pump, independent of the output voltage of the charge pump, non-linearities and DC offsets developed by the charge pump are minimized.

DESCRIPTION OF THE DRAWINGS

These and other features, aspects, and advantages of the present invention will be more fully understood when considered with respect to the following detailed description, appended claims, and accompanying drawings, wherein:

DETAILED DESCRIPTION OF THE INVENTION

In practical terms, lack of perfect symmetry between sourced and sunk charge pump current selectively adds a small component (a DC offset component, a glitch error component, or both) to the control voltage Vc provided to a VCO. These error components selectively shift frequency of a VCO relative to its nominal center frequency. Any offset from the center frequency will cause a phase detector's data capture window to shift, thus allowing a portion of data pulse position distribution to fall outside the detection window, and consequently increasing the system's bit error rate.

Figure 1:
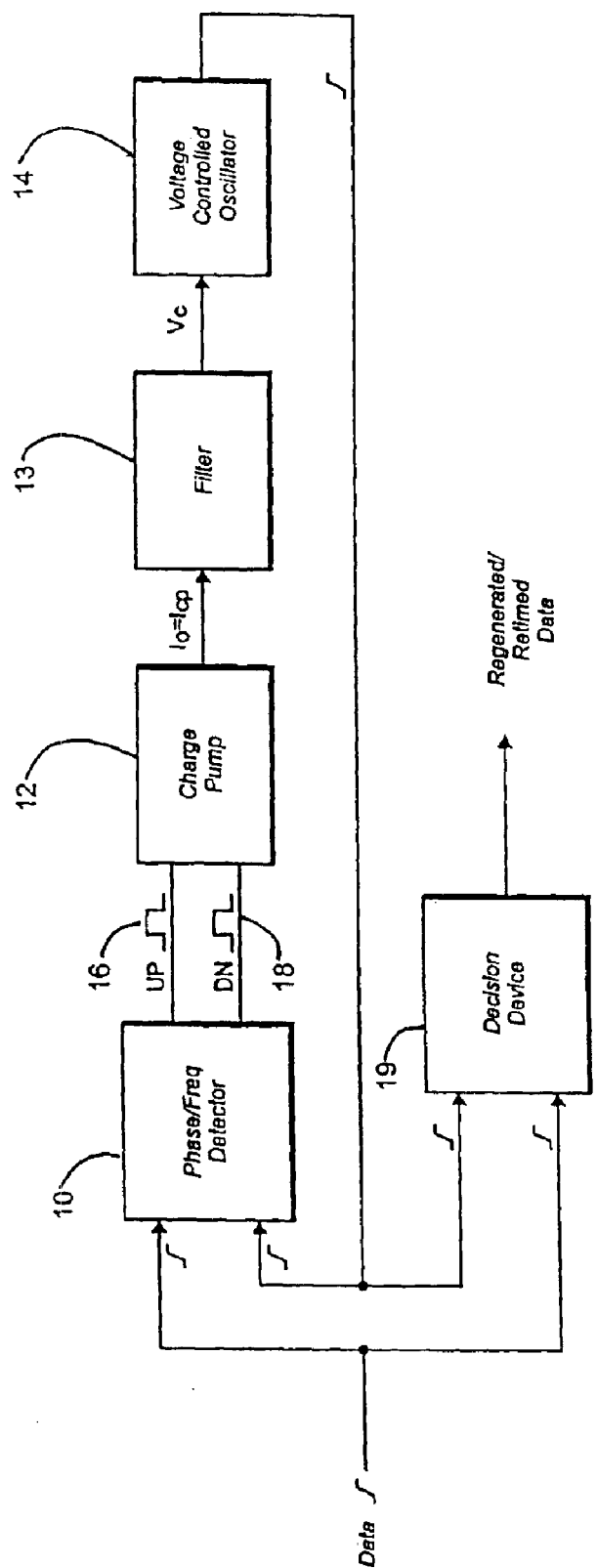
FIG. 1 is a semi-schematic simplified block diagram of a phase-lock-loop, configured to provide timing information to a decision circuit.
Figure 2:
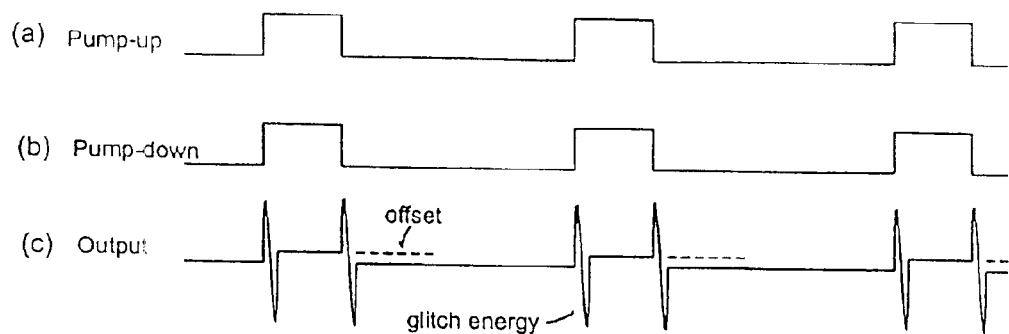
FIG. 2 is a series of waveform diagrams illustrating the effects of glitch energy and DC offset on the output of a charge pump.
Figure 3:
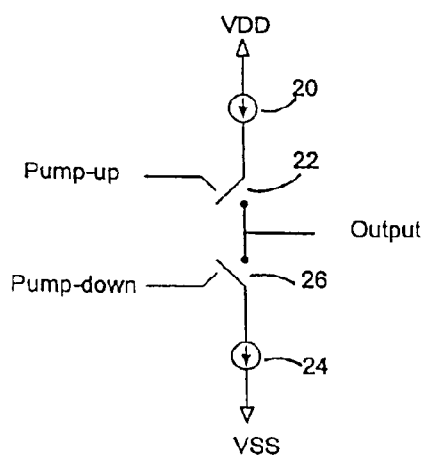
FIG. 3 is a semi-schematic simplified circuit diagram of a conventional charge pump design.
Figure 4:
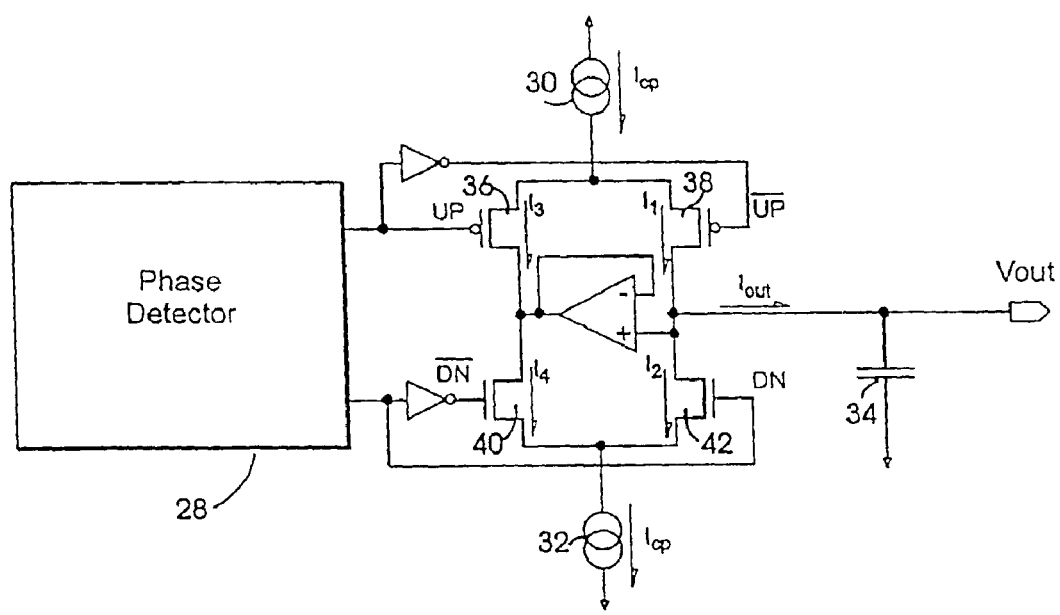
FIG. 4 is a semi-schematic simplified circuit diagram of a charge pump and loop filter coupled to a phase detector in accordance with the prior art.

FIG. 4 illustrates, in simplified semi-schematic circuit diagram form, a typical prior art-type three-state charge pump, coupled to receive PUMP UP and PUMP DN signals from a phase detector 28. The charge pump is implemented as two switched current sources 30 and 32 of a, driving a capacitor 34 which, in turn, defines an output voltage ($V_{OUT}$ or $V_c$). The charge pump switches are disposed as an upper and lower switch bank, the upper switch bank constructed of a pair of P-channel transistors 36 and 38 coupled at their source terminals to an upper current source 30 and whose drains are connected to the drains of a corresponding pair of N-channel transistors 40 and 42 which define the lower switch bank. The lower switch bank transistors have their source terminals connected in common and to the second current source 32. For purposes of explanation, it will be assumed that the upper current source 30 is implemented with PFETs and the lower current source 32 is implemented with NFETs, according to well understood design principles.

In operation, a PUMP UP pulse of characteristic width T would cause a positive output current $+I_{cp}$ to deposit a charge equal to ($I_{cp}T$) on the capacitor 34 of a, for example, loop filter. Likewise, a PUMP DN pulse of width T would cause a negative current $-I_{cp}$ to remove a charge equal to ($I_{cp}T$) from the filter capacitor 34. Thus, in the case of a phase difference, either a positive charge would steadily accumulate on the capacitor, yielding an infinite DC gain for the phase detector, or charge will be steadily removed from the capacitor on every phase comparison, driving DC gain toward negative infinity. In the third state, i.e. "lock" the steady state gain is desirably zero.

An important implication to this type of charge pump design is that offsets and mismatches between the PUMP UP and PUMP DN switch transistors would result in currents being either sourced to or sunk from the capacitor even though the phase detector experiences zero static phase difference at the inputs. Mismatch error is introduced in the behavior of prior art-type charge pumps by implementing the current source switches from different transistor types, i.e., N-channel and P-channel transistors. When these switches turn-off, charge injection and feed-through mismatch, inherent in the different physical properties of P-channel and N-channel transistors, results in an error step at the output which, when fed through the loop filter, perturbs the VCO frequency until the next phase comparison cycle. Moreover, when the switches are turned-off, the upper and lower pump currents generated by the respective current sources 30 and 32, pull their respective source nodes to VDD and ground causing charge-sharing between the capacitor 34 and the internal parasitic capacitances of the various transistors, when the switches are once again turned-on. Since the internal parasitic capacitances of N-channel and P-channel transistors are significantly different, the output is significantly disturbed at turn-on. In addition to disturbing the output at turn-on, the well understood parametric differences between N-channel and P-channel transistors necessarily results in the quantifiable glitches introduced at the output, for PUMP UP and PUMP DN, to be different. Consequently, the average output current is non-zero, i.e., contains a DC offset.

Figure 5:
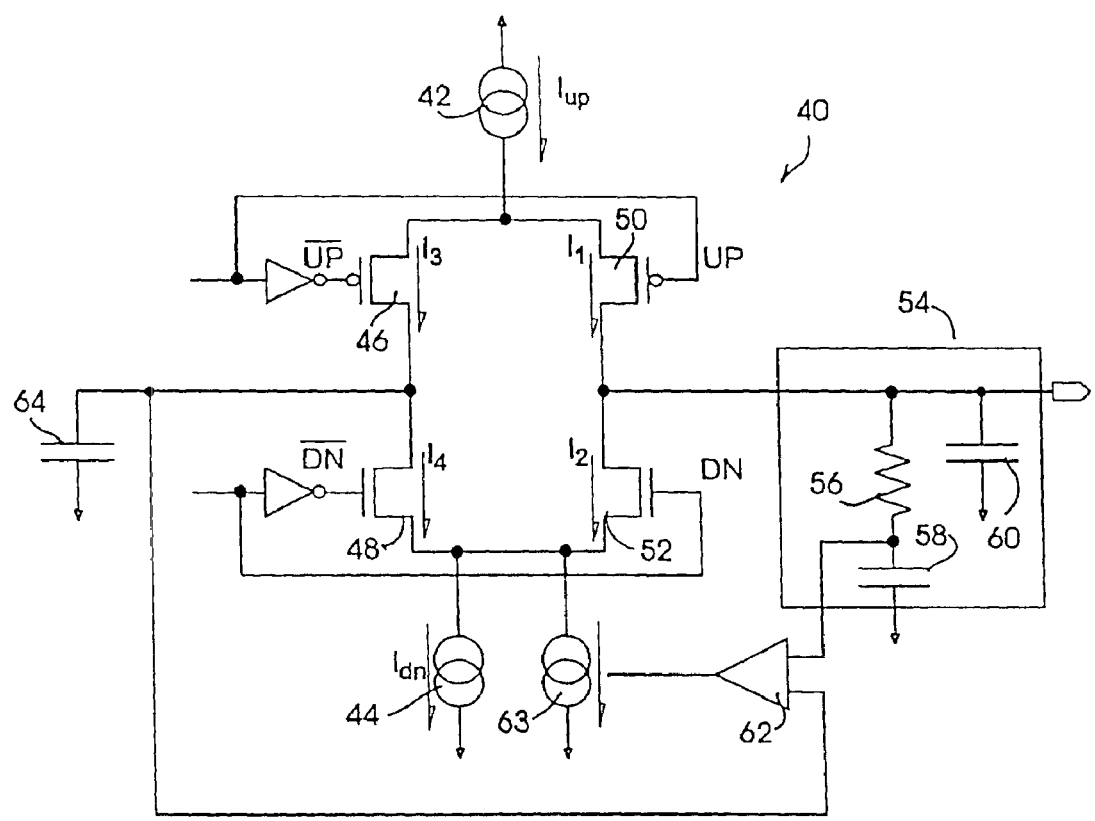
FIG. 5 is a simplified semi-schematic circuit diagram of a low offset and low glitch energy high precision charge pump in accordance with the present invention.

A high precision charge pump configured for use in very high speed applications, such as data and timing recovery circuitry in broadband data communication systems, is depicted in the simplified semi-schematic circuit diagram of FIG. 5. The charge pump, in accordance with the present invention, is seen to be somewhat similar to the conventional charge pump described with reference to FIG. 4, but differs from the prior art design in several significant aspects.

The high precision charge pump, indicated generally at 40 will be understood to be constructed of two parallel current paths, each a mirror image of the other, and both coupled between a pump-up current source 42, connected in turn to VDD, and a pump-down current source (current sink) 44 coupled to VSS.

First current path, i.e., the left current path, is constructed of an upper switch, illustrated in the exemplary embodiment as a P-channel transistor 46, connected in series with a lower switch, illustrated in the exemplary embodiment as an N-channel transistor 48. It should be understood that the active elements according to the invention are current switches, and are only represented as MOSFET transistors for ease of explanation. Likewise, whether the transistors are N-channel or P-channel, is a matter of design choice. One having skill in the art of circuit design will be able to make the appropriate substitutions while still gaining the benefits of the present invention.

Similarly, the second current path, the right current path, is constructed at an upper P-channel transistor 50 and a lower N-channel transistor 52. The P-channel transistors 46 and 50 are mirror images of one another and have their source terminals connected together in common and to the pump-up current source 42. The lower N-channel transistors 48 and 52 are likewise mirror images of one another and also have their source terminals connected in common to the pump-down current source 44.

The gate terminals of the matched N-channel transistors 48 and 52 are configured to be operatively responsive to a PUMP DN signal received from a phase detector, for example. One of the matched N-channel transistors has its gate terminal coupled directly to the PUMP DN signal while the other matched N-channel transistor has its gate terminal coupled to receive the inverse of the PUMP DN signal, which might be implemented by directing PUMP DN through an inverting buffer. Thus, the gate terminal of one of the matched N-channel transistors is coupled to DN, while the gate terminal of the second matched N-channel transistor is coupled to $\overline{\text{DN}}$.

In like fashion, the matched pair of P-channel transistors 46 and 50 are connected to be operatively responsive to the PUMP UP signal with the gate terminal of one of the matched P-channel transistors connected to UP and the gate terminal of the second matched P-channel transistor receiving $\overline{\text{UP}}$. $\overline{\text{UP}}$ is generated by directing UP through an inverting buffer and thence to the gate terminal of the P-channel transistor.

An output node is defined by the common drain nodes of the P-channel and N-channel transistors defining one of the parallel current paths. Source and sink currents are output to an analog loop filter 54 constructed to include an RC network characterized by a resistor element 56 and a capacitor 58 which define the filter's zero. The RC network is coupled between the charge pump output and ground in parallel with a second capacitor 60 which defines the analog loop filter's pole.

An amplifier, such as a transconductance (gm) amplifier 62 has a first input connected to a node defined between the resistor element 56 and zero capacitor 58 of the loop filter's RC network. A second input of the transconductance amplifier 62 is connected to a second output node defined by the common drain terminals of the second parallel conduction path of the charge pump. A dump capacitor 64 is coupled between the second input of the transconductance amplifier 62 and a reference potential in a manner similar to and consistent with the loop filter's zero capacitor 58 and the first input of the transconductance amplifier 62. Thus, the two inputs of the transconductance amplifier will be understood to be in static balance with respect to one another, given the appropriate design values for the dump capacitor 64 and zero capacitor 58.

The output of the transconductance amplifier 62 is coupled to control a third current source 63 which is connected in parallel fashion to the "down" current source 44 between the transistor elements of the charge pump and VSS. Third current source 63 is constructed to conduct an "adjust" current which is nominally zero, and is further constructed to have a limited current conduction range relative to the "down" current source 44.

In operation, the transconductance amplifier 62 functions as a feedback element to drive the dump capacitor node (i.e., the second output node of the charge pump) to the same voltage value as the zero capacitor node, by controlling the value of the "adjust" current source 63. Since the "adjust" current is nominally zero (i.e., the circuit is balanced) the transconductance amplifier 62 requires very little additional power to operate. By maintaining the dump capacitor node and the zero capacitor node at the same voltage during operation of the charge pump, independent of the output voltage of the charge pump, non-linearities and DC offsets developed by the transistor's parasitic capacitances are minimized.

Further, the transconductance amplifier 62 forces the common drain nodes each of the current path of the charge pump 40 to be maintained at an equi-potential value with respect to one another. Thus, transconductance amplifier in combination with the "adjust" current source 63 functions to force the "down" current sunk by the "down" current source 44 to exactly equal the "up" current sourced by the "up" current source 42, in a manner independent of the output voltage of the charge pump. Thus, any DC mismatches between the "up" and "down" current sources which could cause offsets in the charge pump output, are removed. Since the charge pump output nodes are maintained at an equi-potential level, there is no further voltage dependence of the "up" and "down" current sources on the output voltage and DC offsets in the charge pump output are minimized.

It should be realized by one having skill in the art that the third "adjust" current source 63 need not be provided either as a separate element or in parallel with the "down" current source 44. In alternative embodiments, the "adjust" current source may receive a signal from the amplifier 62 and may be partially or wholly provided in parallel with the "pump-up" current source 42. In still other configurations the "adjust" current source 63 might be eliminated as a separate element and the amplifier 62 may be configured to control either the "pump-up" 42 or "pump-down" 44 current sources directly.

A high-speed phase lock loop circuit has been described and includes a high precision charge pump circuit with low offset and low glitch energy which functions to maintain the stability of VCO lock by providing source and sink pump currents which are substantially zero over a phase correction cycle. The uniformity of source and sink currents is imposed by evaluating the voltages at the common drain nodes of the charge pump's first and second parallel conduction paths by a feedback element. The feedback element controls the value of an "adjust" current source so as to drive the two common drain nodes to an equi-potential level.

It will be understood that the "adjust" current source can be implemented as an independent current source which has a limited range relative to the "down" current source or it can be implemented in conjunction with the "down" current source as a secondary element controlled by the charge pump's feedback element. Likewise, the feedback current may be applied to the "up" current source instead of, or in conjunction with the "down" current source.

While the invention has been described in terms of CMOS integrated circuit technology, it will be evident to one having skill in the art that the invention may likewise be suitably implemented in other semiconductor technologies, such as bipolar, bi-CMOS, and the like. Moreover, the circuit according to the invention may be constructed from discrete components as opposed to a monolithic integrated circuit, so long as the individual components are matched as closely as possible to one another.

It will thus be recognized by those skilled in the art that various modifications may be made to the illustrated and other embodiments of the invention described above, without departing from the broad inventive scope thereof. It will be understood, therefore, that the invention is not limited to the particular embodiments or arrangements disclosed, but is rather intended to cover any changes, adaptations or modifications which are within the scope and spirit of the invention as defined by the appended claims.

What is claimed is:

1. A charge pump, comprising:
    a first current source;
    a second current source;
    a first current path, including,
        a first device connected at a first end to the first current source and at a second end to a first output node, and
        a second device connected at a first end to the output node and at a second end to the second current source, a second current path, comprising,
   a third device connected at a first end to the first current source and at a second end to a second output node, and
   a fourth device connected at a first end to the second output node and at a second to the second current source; and
a system that controls a value of the second current source to correct for a voltage difference between the first and second output nodes.

2. The charge pump of claim 1, wherein the system comprises:
   a capacitor connected at a first end to the second output node and at a second end to ground;
   a filter connected at a first end to the first output node; and
   a feedback means having a first input connected to a second end of the filter, a second input coupled to the first end of the capacitor, and an output coupled to one of the first and second current sources.

3. The charge pump of claim 1, wherein the charge pump is implemented using CMOS technology.

4. The charge pump of claim 2, wherein the feedback means is coupled to one of the first and second current sources via an adjusting current source.

5. The charge pump of claim 4, wherein the adjusting current source is coupled between the feedback means and one of the first and second current sources.

6. The charge pump of claim 2, wherein the feedback means is coupled directly to one of the first and second current sources.

7. The charge pump of claim 2, wherein the filter is an analog loop filter.

8. The charge pump of claim 2, wherein the filter comprises:
   a resistor;
   a first capacitor coupled in series with the resistor; and
   a second capacitor coupled in parallel with the resistor and the first capacitor,
   wherein an input to the feedback means is coupled to a node between the resistor and the first capacitor.

9. The charge pump of claim 8, wherein:
   the feedback means is an amplifier;
   the capacitor in the system is coupled between a reference potential and another input of the amplifier, such that the inputs of the amplifier are in static balance with respect to one another.

10. The charge pump of claim 2, wherein the feedback means is an amplifier.

11. The charge pump of claim 1, wherein:
   the first device is a first switching device; and
   the second device is a second switching device.

12. The charge pump of claim 11, wherein the first and second switching devices are transistors.

13. The charge pump of claim 1, wherein
   the third device is a first switching device; and
   the fourth device is a second switching device.

14. The charge pump of claim 13, wherein the first and second switching devices are transistors.

* * * * *